United States Patent [19]

Taylor et al.

[11] 3,783,345

[45] Jan. 1, 1974

[54] HEAT-DISSIPATING ENCAPSULATED SEMI-CONDUCTOR ASSEMBLY

[75] Inventors: Thomas D. Taylor, Roanoke; Harvey F. Bredlow, Salem, both of Va.

[73] Assignees: Graham-White Manufacturing Company, by said Taylor; Graham-White Sales Corporation, Salem, Va. ; by said Bredlow

[22] Filed: Sept. 8, 1971

[21] Appl. No.: 178,612

[52] U.S. Cl. ..... 317/234 R, 317/234 A, 317/234 F, 317/234 E, 174/52 S

[51] Int. Cl. ..... H01l 3/00, H01l 5/00

[58] Field of Search ..... 317/234, 1, 3, 3.1, 317/4, 4.1; 174/52 S

[56] References Cited

UNITED STATES PATENTS

| | | | |
|---|---|---|---|
| 2,967,984 | 1/1961 | Jamison | 317/234 |
| 3,179,853 | 4/1965 | Kozacka | 317/234 |
| 3,264,248 | 8/1966 | Lee | 317/234 |
| 3,290,564 | 12/1966 | Wolff | 317/234 A |
| 3,377,524 | 4/1968 | Bock et al. | 317/234 A |

*Primary Examiner*—John S. Heyman
*Assistant Examiner*—Andrew J. James
*Attorney*—Wilmer Mechlin

[57] ABSTRACT

A diode or other semi-conductor device encapsulated with a directly connected heat sink in a heat-conductive, electrically insulating plastic matrix and dissipating heat generated by the device from the heat sink to a mounting bracket through a thickness of the matrix only sufficient for electrical insulation.

6 Claims, 7 Drawing Figures

PATENTED JAN 1 1974

3,783,345

Inventors:
Thomas D. Taylor
Harvey F. Bredlow
By Wilmer Mechlin
their Attorney

HEAT-DISSIPATING ENCAPSULATED SEMI-CONDUCTOR ASSEMBLY

BACKGROUND OF THE INVENTION

While semi-conductor devices have previously been protected by encapsulating them in high silica epoxy or other heat-conductive, electrically insulating plastic matrices, as in Kozacka U. S. Pat. No. 3,179,853 and Winter U. S. Pat. No. 3,327,180, it heretofore has been the practice to depend for heat dissipation on transferring generated heat from the device through the matrix to an external heat conductor. However, although high relative to most other plastics, the heat conductivity of high silica epoxy is low relative to metal conductors, with consequent inefficient heat transfer and potential overheating. It is with a solution for this problem that the present invention is primarily concerned.

SUMMARY OF THE INVENTION

The primary object of the present invention is to provide an improved semi-conductor assembly having a semi-conductor device encapsulated in a heat conductive, electrically insulating plastic matrix, whereby by encapsulating in the matrix a heat sink thermally connected directly to the device and transferring heat generated by the device from the heat sink to a heat conductor at least partly external of the matrix and spaced and electrically insulated by the matrix from the heat sink external of the matrix, the heat generated by the device is effectively dissipated.

Another object of the invention is to provide an improved semi-conductor assembly of the character described in the preceding object, wherein the heat conductor is a mounting bracket having a part thereof confronting the heat sink for receiving heat therefrom and the confronting part is embedded in the matrix for securely attaching the mounting bracket thereto.

An additional object of the invention is to provide an improved encapsulated semi-conductor device and heat sink assembly wherein the device is a diode-thyrector complex protecting against both wrong polarity input and high transient voltage spikes.

Other objects and advantages of the invention will appear hereinafter in the detailed description, be particularly pointed out in the appended claims and be illustrated in the accompanying drawings, in which:

FIGURE DESCRIPTION

DETAILED DESCRIPTION

Figure 1:
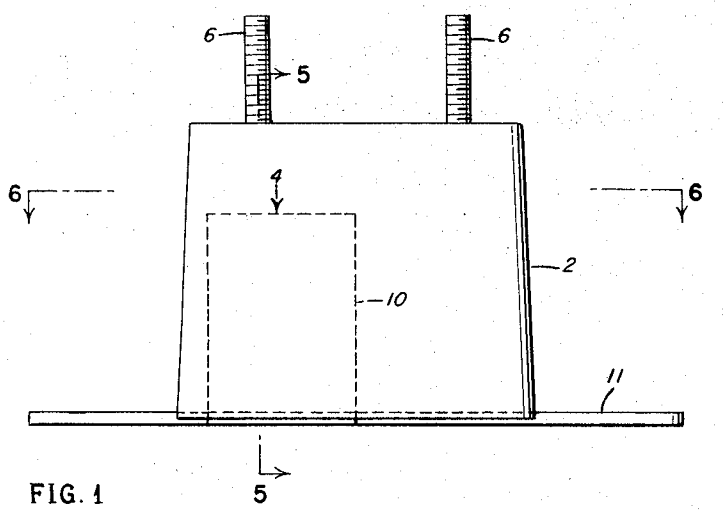
FIG. 1 is a side elevational view of a preferred embodiment of the improved semi-conductor assembly of the present invention.
Figure 3:
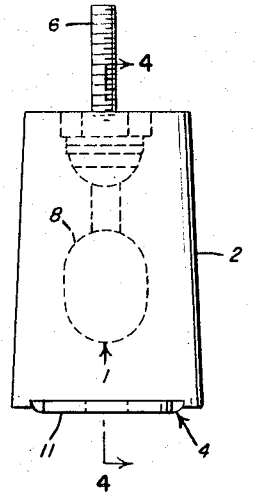
FIG. 3 is an end elevational view of the assembly of FIG. 1.
Figure 2:
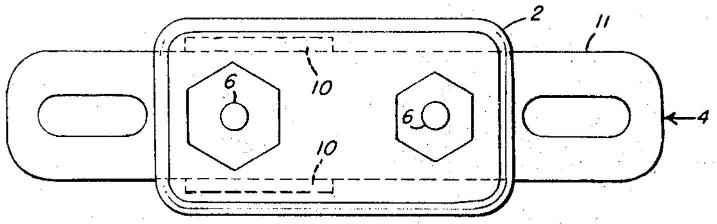
FIG. 2 is a plan view of the assembly of FIG. 1.

Referring now in detail to the drawings in which like reference characters designate like parts, the improved semi-conductor assembly of the present invention is adapted for installations in which it is advantageous to encapsulate a semi-conductor device in a protective plastic matrix without posing an overheating problem, and in the illustrated embodiment is particularly designed for both eliminating overheating and protecting against high transient voltage spikes.

Basically, the improved assembly is comprised of a semi-conductor device 1 encapsulated or embedded in a high silica epoxy or other suitable heat-conductive, electrically insulating plastic matrix or capsule 2, a heat sink 3 directly connected to the semi-conductor device 1 and encapsulated therewith in the matrix, and a mounting bracket or other heat-conductive member 4 secured to the matrix and having a part 5 adjacent and electrically insulated from the heat sink for receiving heat from the heat sink through an intervening thickness of the matrix.

Figure 7:
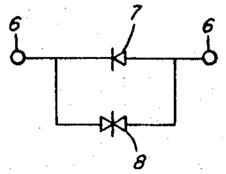
FIG. 7 is a schematic wiring diagram of the preferred diode-thyrector complex of the improved assembly of the preceding figures.
Figure 4:
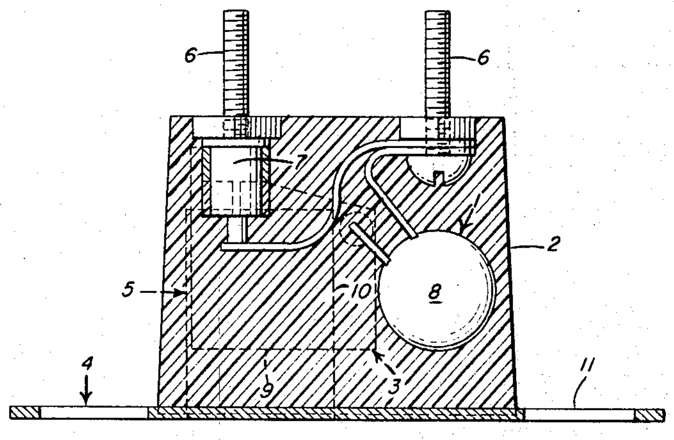
FIG. 4 is a vertical sectional view taken along lines 4—4 of FIG. 3.
Figure 5:
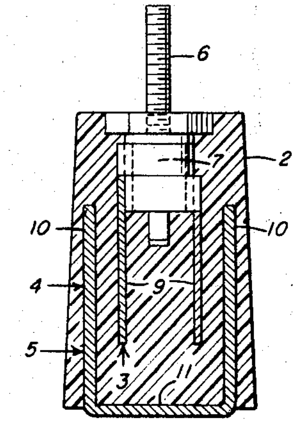
FIG. 5 is a vertical sectional view taken along lines 5—5 of FIG. 1.
Figure 6:
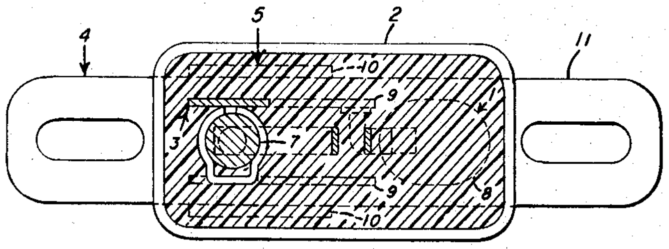
FIG. 6 is a horizontal sectional view taken along lines 6—6 of FIG. 1.

The improved assembly has a pair or plurality of terminals 6 threaded or otherwise suitably fitted for connection in the electrical circuit (not shown) to which it is to be applied and, conveniently, both electrically insulated and fixed or secured in place by being partly embedded in spaced relation in the matrix 2. Particularly designed for use in a direct current circuit for protection against both accidental reversal of polarity and transient high voltage spikes, the illustrated assembly has as its semi-conductor device 1 a diode 7 and a thyrector 8 connected in parallel across the terminals 6, as shown schematically in FIG. 7. Of these components the diode 7, within an applied voltage range up to its peak input voltage, will pass current of positive polarity in only one direction and necessarily must be conductive for current to flow through the associated electrical circuit. The diode therefore will be operative whenever the circuit is closed and operating. As opposed, the thyrector 8 should have a threshold voltage above the operating voltage to prevent breakdown of the diode by damping transient high voltage spikes of higher voltage than the diode's peak input voltage and in performing this function the thyrector is conductive only intermittently and momentarily. Consequently, the diode is the main and for all practical purposes the only source of the heat generated by the illustrated device 1 while the circuit is closed or operating and it is this heat that must be dissipated if the device is to remain operative.

While, with its high silica content, the preferred epoxy matrix 2 is a far better heat conductor than plastics in general, its heat conductivity is still too low to dissipate the heat generated by the diode 7 of the exemplary assembly 1 unless the matrix is of impractically large bulk. The present solution to the problem is to transmit the heat generated by the semi-conductor device 1 directly to the heat sink 3 and therefrom, through a minimum thickness of the matrix 2, to a mounting bracket 4 or other member at least partly outside or external of the matrix. To be effective, both the heat sink 3 and the partly or wholly exposed or external member 4 must be of high heat conductivity or have a high heat transfer coefficient relative to the matrix 2 and present or expose to each other an area sufficient for transfer therebetween, by radiation and conduction through the intervening thickness of the matrix, of the heat required to be dissipated.

The illustrated embodiment fulfills the above requirements by using as its heat sink 3 a pair of laterally spaced, substantially flat and parallel metal plates 9 clipped or otherwise connected for heat transfer directly to the diode. Connected at the top to and straddling the diode, the plates 9 depend or extend downwardly therefrom within the matrix 2 and part 5 of the member 4, electrically insulated and receiving heat from the plates, preferably is in the form of a pair of flat metal ears or outer plates 10 straddling and spaced from the plates 9 and integral with and upstanding or projecting from opposite sides of a base or other external or exposed portion 11 of the member 4. Electrically insulated from the inner plates 9 of the heat sink 3 by intervening thicknesses of the matrix 2 sufficient for the purpose, the ears 10 may be either outside of or embedded or encapsulated in the matrix, the latter being preferred as a convenient way for securing or fixing the member 4 to the matrix.

The inner and outer pairs of plates 9 and 10, respectively, may be made of any metal of suitable heat conductivity, such as aluminum, copper, brass or steel. Since encapsulated in the matrix 2, the inner plates 9 directly connected to the diode 7 are under no physical stress in service and can be made of thin brass or copper. However, if, as in the illustrated embodiment, the outer plates or ears 10 are part of a mounting bracket through which the assembly is mounted in the intended installation, greater physical strength is required and a suitable metal is cadmium-plated or other corrosion-resistant steel. Since the heat conductivity of steel is less than that of copper or brass, this in turn requires the outer plates to have greater mass than the inner for comparable heat diffusivity, while, as in the illustrated embodiment, the high electrical conductivity of the preferred brass inner or heat sink plates enables either or both to serve as the electrical connection or lead between a side of the thyrector 8 and the terminal 6 to which the diode 7 has one side directly connected.

Dependent on the intervening thickness of the matrix 2 for electrical installation, but for heat transfer mainly on radiation between their confronting surfaces, assisted by conduction through the matrix, the heat sink and bracket plates 9 and 10 must confront or overlap over a sufficient area to transfer the excess generated heat otherwise causing overheating, to the outer plates and therethrough to the external or exposed base 11 of the mounting bracket 4. The heat transferred to the base 11 or other exposed part must be dissipated at the rate at which it is received, but the large surface exposure required if ambient air is the recipient, is rendered unnecessary, when, as in the usual installation of the preferred assembly, the base is bolted or secured directly to a metal panel (not shown) which conducts away the received heat.

An exemplary assembly according to the present invention has as its diode 7 and IR 80 – 0144 and thyrector 8 a G.E. 6RS20SJ4B4AF. The particular diode can generate as much as 10 watts of heat for a short time and continuously generate about 4 watts. Molded with the terminals 6, the diode 7 and thyrector 8 in the preferred high silica epoxy matrix, the inner brass heat sink plates 9 and outer cadmium-plated bracket ears 10 have thicknesses of about 0.025 inch and 0.062 inch, respectively, and a total confronting surface area between the inner and outer plates of about 0.635 sq. in. Of these dimensions and with the base plate 11 bolted or otherwise secured directly to a suitable metal mounting panel, the plates 9 and 10 will effectively dissipate the heat generated in operation by the exemplary diode.

From the above detailed description it will be apparent there has been provided an improved encapsulated semi-conductor assembly capable of effectively dissipating the heat generated in operation by a semiconductor device, despite encapsulation of the latter in a plastic matrix. It should be understood that the described and disclosed embodiment is merely exemplary of the invention and that all modifications are intended to be included that do not depart from the spirit of the invention and the scope of the appended claims.

Having described my invention, I claim:

1. An encapsulated semi-conductor assembly, comprising a semi-conductor device, a heat-conductive, electrically insulating plastic matrix encapsulating said device, a heat sink encapsulated in said matrix and connected for heat transfer directly to said device for receiving heat generated thereby, and means at least in part external of said matrix and spaced and electrically insulated thereby from said heat sink for receiving heat therethrough from said heat sink, said heat sink and receiving means being metal members of high heat conductivity relative to said matrix.

2. An assembly according to claim 1, wherein the matrix is a high silica epoxy.

3. An assembly according to claim 2, wherein the heat-receiving means is a mounting bracket securable directly to a metal mounting panel for transferring received heat thereto.

4. An assembly according to claim 3, wherein the heat sink includes a pair of inner metal plates thermally connected to the device and spaced therebeyond, and said receiving means includes a pair of outer plates straddling and spaced and electrically insulated by the matrix from said inner plates.

5. An assembly according to claim 4, wherein the outer plates are encapsulated in the matrix.

6. An assembly according to claim 5, including spaced terminals partly embedded in and projecting from the matrix, and wherein the device includes a diode and a thyrector connected in parallel between said terminals, and the inner heat sink plates are heat and electrically conductive and at least one thereof connects a side of the thyrector to one of said terminals.

* * * * *